United States Patent [19]

Collins

[11] 3,810,022

[45] May 7, 1974

[54] DIGITAL TO ANALOG CONVERTER TELEVISION TUNING OF VARACTOR TUNERS

[75] Inventor: Johnny Collins, Harvey, Ill.

[73] Assignee: Zenith Radio Corporation, Chicago, Ill.

[22] Filed: July 21, 1972

[21] Appl. No.: 273,891

[52] U.S. Cl. .................... 325/459, 325/464, 334/15

[51] Int. Cl. .................... H04b 1/16

[58] Field of Search ........... 335/459, 468, 469, 464, 335/465, 462; 334/15, 7; 340/347 DA

[56] References Cited

UNITED STATES PATENTS

| | | | |
|---|---|---|---|
| 3,571,720 | 3/1971 | Heagney | 325/465 |
| 3,568,112 | 3/1971 | Thomas | 334/15 X |
| 3,504,362 | 3/1970 | Feldmann | 340/347 DA |
| 3,541,354 | 11/1970 | Basham | 340/347 DA |

*Primary Examiner*—Benedict V. Safourek
*Attorney, Agent, or Firm*—Nicholas A. Camasto; John J. Pederson

[57] ABSTRACT

A digital to analog converter effects limited and substantially equal fine tuning ranges for all channels tuned by a television tuning system incorporating a varactor tuner tunable by tuning voltages applied to a control element. The digital to analog converter derives from coarse tuning voltages established in response to channel decade selection fine tuning voltages in response to channel unit selections. It comprises a voltage dividing network, including the control element, coupled to the coarse tuning voltages and to means responsive to unit selections providing a control effect, to restrict the tuning ranges of the coarse tuning voltages in response to the control effect. The digital to analog converter also provides means for applying the fine tuning voltages to the control element.

3 Claims, 2 Drawing Figures

DIGITAL TO ANALOG CONVERTER TELEVISION TUNING OF VARACTOR TUNERS

RELATED APPLICATIONS

This application is related to copending applications Ser. Nos. 262,859 and 268,435 filed June 14, 1972 and July 3, 1972, respectively in the names of Melvin C. Hendrickson and Johnny Collins, Melvin C. Hendrickson and Akio Tanaka, which are assigned to the assignee of the present invention and which disclose and claim distinct and separate inventions having preferred embodiments common to the one disclosed for the present invention.

BACKGROUND OF THE INVENTION

The invention relates in general to a television tuning arrangement and in particular to a varactor tuning system for a television receiver.

Television receivers today are required to have a tuner arrangement capable of receiving numerous VHF channels and UHF channels. Until recently this requirement could be made with a 13-position tuning apparatus in which 12 of the positions are allocated to VHF channels and selected by a switch or turret-type tuner while a desired one of the UHF channels is selected by adjusting a separate continous-type tuner which is activated when the tuning apparatus is positioned to the 13th or UHF position. However, in order to comply with regulations recently adopted by the Federal Communications Commission, the tuning apparatus for a domestic television receiver will have to afford the view "equalized tuning" in the VHF and UHF bands. Stated simply, this requirement means that the tuning arrangement must be so designed as to enable the viewer to select, with equal ease, a VHF channel or a UHF channel.

In the past, the manner in which the VHF or UHF channels were selected posed no significant problems since the 13-position detent-type tuner was not only practical but acceptable. It would then seem that the obvious solution to "equalize" tuning would be to provide a UHF tuner with a detent or stop for each UHF channel. While such a detent arrangement is obtainable, it is not practical in view of the fact that a channel assignment for each UHF channel in the UHF spectrum must be accommodated.

One tuning system proposed to provide equalized tuning for both VHF and UHF tuning incorporates a VHF tuner of the varactor type which is tuned with a turret-type tuning arrangement. One position of the turret is provided for UHF reception and switches the UHF tuner into the television circuit. The UHF tuner is provided with a six-position stop tuning arrangement where, for each stop, a given UHF channel may be preselected. The problem with this system, however, has been that the tuning of a UHF station has been rather complicated. The preselection range for each UHF position encompasses all UHF channels as compared to a fine tuning range of just a few channels for each VHF position. Such a system does not afford the user the feature of complete equalized tuning.

It is therefore an object of the present invention to provide an improved tuning system of the varactor type for a television receiver.

It is also an object of the present invention to provide a television tuning system which affords complete equalized tuning for VHF and UHF reception to the user.

It is still a further object of the invention to provide a means effecting limited and substantially equal fine tuning ranges for all channels received by a television tuning system incorporating a varactor tuner.

The present invention provides in a television tuning system comprising a varactor tuner tunable by tuning voltages to a control element, channel selection means for digitally selecting any channel by decade and unit selection, means for establishing coarse tuning voltages defining a relatively broad tuning range in response to the decade selection, and means effecting limited and substantially equal fine tuning ranges for all channels. It comprises means responsive to the unit selection for providing a control effect, voltage dividing means including the control element coupled to the means for establishing the coarse tuning voltages and to the means responsive to the unit selections to derive from the coarse tuning voltages fine tuning voltages which define limited and substantially equal fine tuning ranges for all unit selections, and means for applying the fine tuning voltages to the control element.

BRIEF DESCRIPTION OF THE DRAWINGS

The features of the present invention which are believed to be novel are set forth with particularity in the appended claims. The invention, together with further objects and advantages thereof, may best be understood by reference to the following description in conjunction with the accompanying drawings, and in the several figures of which like reference numerals indicate identical elements and in which:

Figure 1:
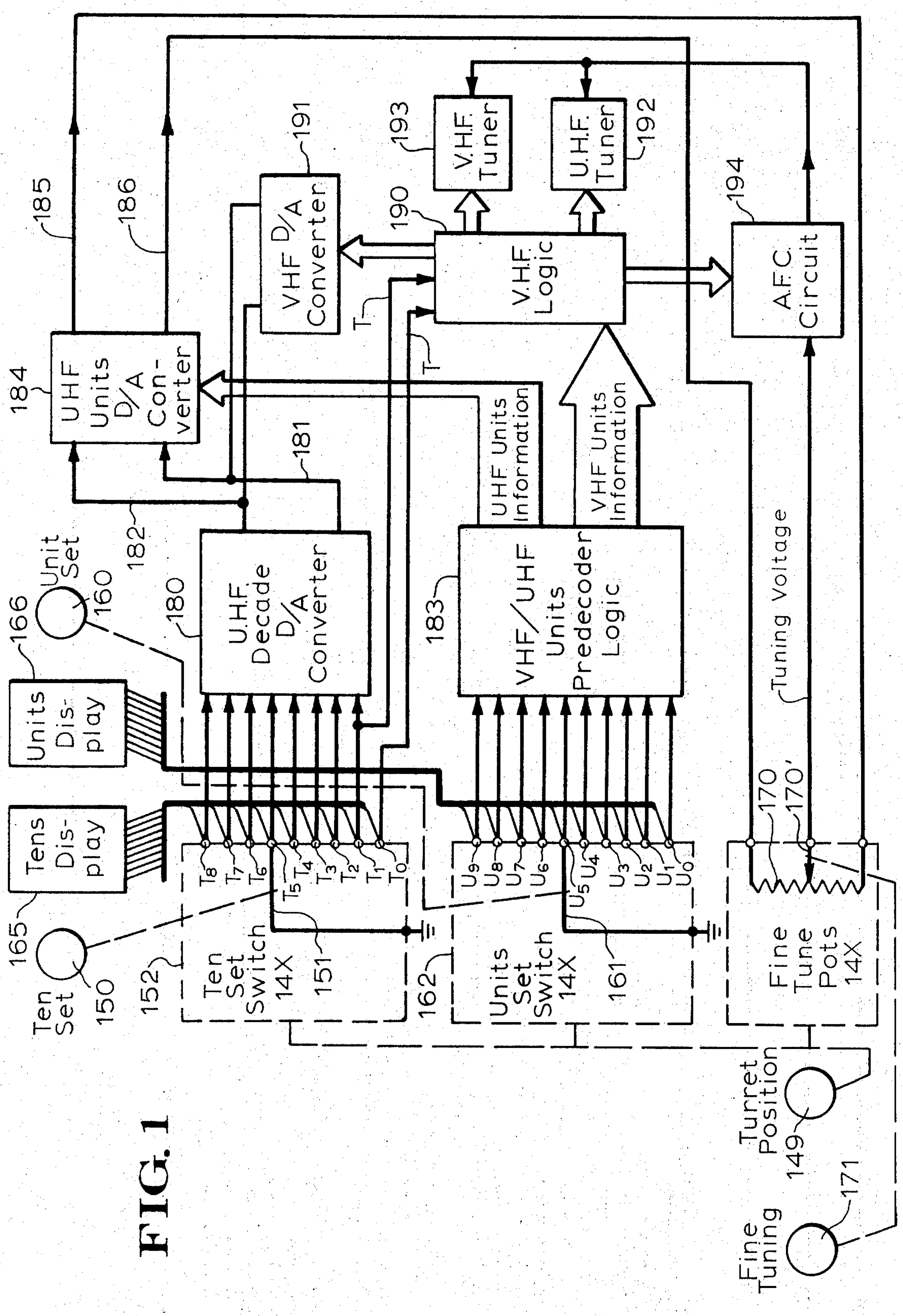
FIG. 1 is a block diagram of a VHF-UHF television tuning system embodying the present invention.

A tuning system embodying the present invention is shown in block diagram form in FIG. 1. It employs a 14-position mechanical device such as a turret, each position of which is selectable by turret position knob 149, and is capable of setting the tuning system to either a VHF or UHF channel in an equalized manner. Associated with each position on the turret are two switches each having multiple contacts, one switch for selecting a desired channel decade and the second switch for selecting the channel unit within the selected decade. The proper decade is selected by ten-set knob 150 which is coupled to pole 151 of ten-set switch 152. Units set knob 160 is coupled to pole 161 of units set switch 162. For any position of the turret, the user may select any desired channel (VHF or UHF) which is appropriately displayed on tens display 165 and units display 166. The proper channel display is obtained by grounding one of the contacts of the ten-set switch and the unit-set switch with poles 151 and 161 respectively. Also associated with each of the 14 positions on the turret is a control element, fine tuning variable resistor 170, adjustable with fine tuning knob 171 engaging wiper 170'. Variable resistor 170 has applied across its end terminals two tuning voltages each capable of tuning the system to one of two predetermined frequencies, one below and one above the desired channel, and utilizes them to apply an intermediate tuning voltage to the proper tuner to tune it to the desired channel between the two predetermined frequencies.

The two tuning voltages are established across resistor 170 in response to the ten-set switch 152 and units-set switch 162 selections. For instance, if a VHF channel is selected, a B+ activating voltage is applied to the VHF tuner and two tuning voltages are applied to resistor 170. Resistor 170 then applies an intermediate tuning voltage to the VHF tuner 193 to tune it to the desired channel. The system operates in a similar manner for a given UHF channel selection in which case the intermediate tuning voltage is applied to UHF tuner 192. In accordance with the present invention, the difference between the two predetermined tuning frequencies is approximately equal for both UHF and VHF reception so that the fine tuning of the desired channel will have the same relative effect for both UHF and VHF reception.

Considering the case of UHF reception first, a first pair of predetermined tuning frequencies are established by UHF decade digital to analog (D/A) converter 180 which establishes a pair of coarse tuning voltages capable of tuning the UHF tuner to any channel within a relatively broad tuning range such as a decade of channels. For instance, if channel 55 is desired, pole 151 of ten-set switch 152 grounds the $T_5$ position and provides UHF decade digital-to-analog converter 180 with an appropriate input for establishing a coarse tuning voltage at lines 181 and 182 capable of tuning the UHF tuner to channels 50 and 60 respectively. Pole 161 of unit switch 162 grounds the $U_5$ position as shown and supplies an appropriate input to VHF-UHF units pre-decoder logic circuit 183 which supplies UHF units information to the UHF units digital to analog converter 184. The UHF units information from the VHF-UHF units pre-decoder logic circuit supplies an appropriate input to the UHF units digital to analog converter to derive from the coarse tuning voltages fine tuning voltages in accordance with the units information to establish a second pair of predetermined tuning frequencies. Now, instead of tuning between channels 50 and 60 to obtain reception of channel 55, the tuning of channel 55 will be over a much narrower range, for example 53–57. This provides the same fine tuning effect as that encountered for VHF reception. The tuning voltages established at the output of the UHF units digital to analog converter 184 are impressed on lines 185 and 186 which is applied across the control element, variable resistor 170. Wiper 170', in being moved across the fine tuning control 170, tunes UHF tuner 192 within the restricted range established by the second pair of predetermined tuning frequencies to the desired channel, in this case channel 55. This tuning voltage is then fed to UHF tuner 192 via AFC circuit 194 which makes necessary tuning corrections to keep UHF tuner 192 tuned to channel 55.

For VHF reception pole 151 on the ten-set switch grounds either the $T_1$ or the $T_0$ position since channels 1–19 are then selectable in these two positions. This information is applied to the VHF logic circuit 190. The units information from the units set switch is also impressed on the VHF logic circuit 190. The VHF logic circuit supplies appropriate operating potentials to the VHF tuner and appropriate information to the VHF digital to analog converter 191 to establish tuning voltages across lines 181 and 182 to establish a predetermined tuning frequency on each side of the desired channel. The tuning voltages established across lines 181 and 182 correspond to predetermined tuning frequencies spaced apart by approximately the same number of channels as in the UHF case. The VHF tuning voltages on line 181 and 182 are directly translated to lines 186 and 185 respectively, since the UHF units and decade digital to analog converters are inoperative in the VHF case. The tuning voltages on lines 185 and 186, as in the case of UHF operation, is applied across variable resistor 170 for fine tuning purposes. Wiper 170' then is adjusted to apply to VHF tuner 193 an intermediate tuning voltage to tune it to the desired channel. The voltage on wiper 170' is applied to VHF tuner via the AFC circuit 194 which, as in the case of UHF tuning, maintains this tuning voltage so that the VHF tuner will not drift off frequency.

The VHF logic circuit 190 also switches the AFC circuit into one of two operating modes. For UHF tuning, less AFC voltage is required to achieve a given amount of tuning correction than is required for VHF reception. In essence, the VHF logic circuit makes the AFC circuit more sensitive for VHF reception. This is known in the art as AFC equalization. AFC equalization along with the substantially equal separation of the predetermined tuning frequencies for UHF and VHF tuning, allows complete equalized tuning for VHF and UHF reception.

Figure 2:
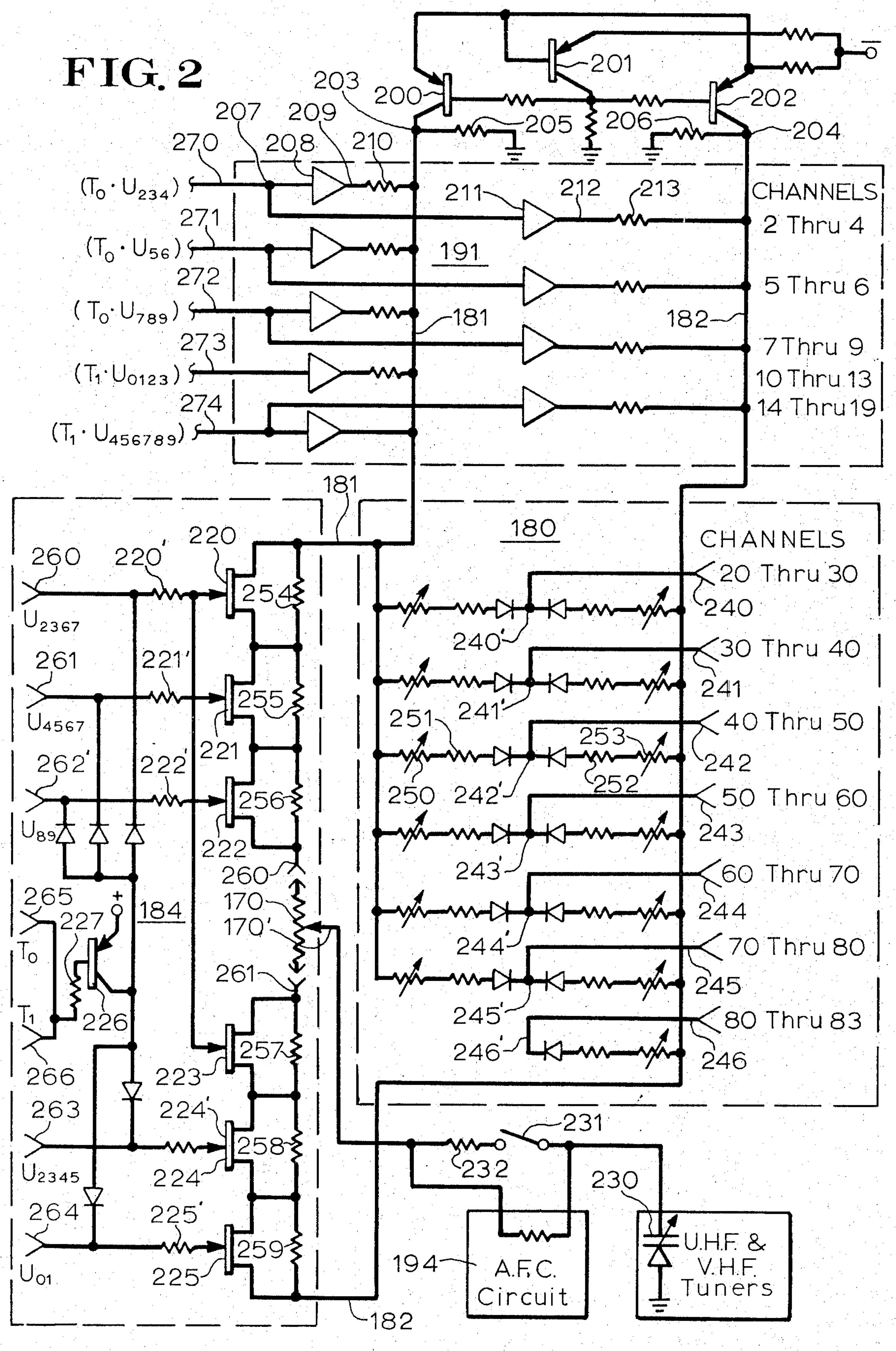
FIG. 2 is a detailed schematic circuit diagram of the system of FIG. 1 embodying the present invention.

In FIG. 2 is shown a schematic circuit diagram showing the VHF digital to analog converter 191, the UHF decade digital to analog converter 180, and the UHF units digital to analog converter 184 in greater detail. Transistors 200–202 establish two different constant current sources, one at collector 203 and the other at collector 204. Transistor 201 establishes the appropriate biasing level for the constant current sources of transistors 200 and 202. This circuit maintains a constant current at collectors 203 and 204.

Resistor 205 provides a path to ground for the current at collector 203 and resistor 206 provides a current path to ground for the current at collector 204. The current paths created by resistors 205 and 206 establish a voltage potential on each of lines 181 and 182, the potential on line 181 being smaller than the potential on line 182 by fixing the value of resistor 205 at a lower resistance than resistor 206. The potential from lines 181 and 182 to ground is varied by appropriately switching in different extra loads from the lines to ground depending upon which channel the user selects.

For tuning channels 2–19 the VHF digital to analog converter 191 is utilized. It operates in response to input signals applied to its input terminals 270–274 supplied by the VHF-UHF units pre-decoder logic circuit 183 in conjunction with the VHF logic circuit 190. The input signals are applied to terminals 270–274 in response to the tens-set switch and units-set set switch selections as represented by the selection switch conditions in parenthesis. For example, terminal 270 receives an input signal only when the tens-set switch is in the $T_0$ position and when the units-set switch is simultaneously in the $U_2$, $U_3$ or $U_4$ position corresponding to channels 2, 3 or 4. Terminal 272 receives an input signal only when the tens and units selection switches select channels 7, 8 or 9. It is assumed for this discussion that given the necessary input information for the VHF-UHF units pre-decoder logic and the VHF logic, and that by utilizing well known logic design practices, one skilled in the art may obtain the particular logic circuitry necessary for practicing the present invention.

If the tens-set switch is placed in the $T_0$ position and the units-set switch is placed in the $U_2$ position, thus indicating that the user desired to receive channel 2, the logic circuits 183 and 190 provide input 207 of the non-inverting driver 208 an input signal forcing it towards ground potential which establishes the output 209 of the non-inverting driver at ground potential. This connects resistor 210 in parallel with resistor 205. Non-inverting driver 211, being coupled to input 207 of non-inverting driver 208, also has its output 212 go to ground potential, thus placing resistor 213 in parallel with resistor 206. This decreases the potential on each of the lines 181 and 182, and establishes on each of the lines tuning voltages which allow the VHF tuner to be tuned within the range of channel 2.

The voltage on the tuning lines is applied across variable resistor 170 via UHF units digital to analog converter 184 to fine tune the VHF tuner to channel within the range of the predetermined tuning frequencies. Field effect transistors 220–225 are in the conducting state, thus shorting out the resistors coupled across their main terminals, and allow the potential on lines 181 and 182 to be applied across variable resistor 170. The gates of the field effect transistors 220–225 are coupled to transistor 226 whose base 227 is coupled to $T_0$ and $T_1$ terminals 265 and 266 respectively of tens-set switch 152 of FIG. 2. Any time a VHF channel is selected, base 227 is set at ground potential allowing transistor 226 to conduct, forcing FET transistors 220–225 to conduct and thus shorting out the resistors coupled across their main terminals. This allows the potential on buses 181 and 182 to be applied across resistor 170.

The operation of the VHF digital to analog converter is identical for all channels from channel 2 to channel 19. The VHF tuner is operative for channel selections from 2 to 13, and the UHF tuner is operative for selections of 14 through 19. For each channel selected, a pair of tuning potentials is applied across variable resistor 170. Wiper 170' fine-tunes the VHF and UHF tuners to the desired channel within the range of the predetermined frequencies established by the potentials on lines 181 and 182, by applying an intermediate tuning voltage to the tuners represented by varactor diode tuning element 230. Switch 231 switches load resistor 232 out of the AFC circuit to make the AFC more sensitive for VHF reception.

For UHF reception from channels 20 through 83, and in accordance with the present invention the UHF decade digital to analog converter 180 establishes coarse tuning voltages on lines 181 and 182 capable of tuning the UHF tuner to predetermined frequencies spaced apart by decades. Terminals 240–246 are coupled to switch positions of $T_2$ to $T_8$ respectively of ten-set switch 152 of FIG. 1. For any position of the ten-set switch of $T_2$–$T_8$ terminals 240'–246' are appropriately grounded. For instance, if the viewer wishes to receive channel 44 by setting ten-set switch 152 of FIG. 1 in the $T_4$ position, terminal 242' is in turn grounded. This establishes the series connection of resistors 250 to 251 in parallel with resistor 205 and the series connection of resistors 252 and 253 in parallel with resistor 206. This establishes on lines 181 and 182 coarse tuning voltages capable of tuning the UHF varactor tuner to channels 40 and 50 respectively. Resistors 250 and 253 are variable to enable fine adjustment of the tuning voltages to the predetermined voltage desired. The coarse tuning voltages thus established in lines 181 and 182 are then applied across two sets of serially connected switches, field effect transistors 220–225. The field effect transistors in conjunction with their gate input resistors 220'–225' and resistors 254–259 coupled across the main terminals of field effect transistors 220–225 respectively forming a voltage dividing means comprise the UHF unit digital to analog converter 184 of FIG. 2. It further restricts the tuning range between the predetermined UHF channels to approximately the range between the two predetermined tuning frequencies for VHF tuning. In response to the particular units selection on units switch 162 certain ones of FET transistors 220–225 conduct and certain ones do not conduct, to divide down the voltage across lines 181 and 182 applied to control element resistor 170 to restrict its tuning range.

The FET transistors which conduct and those which do not conduct for a given UHF channel selection are represented by the unit sub-numeral. Input terminals 260–264 of UHF units digital to analog converter 184 are coupled to field effect transistors 220–225 and to the VHF-UHF units pre-decoder logic 183 of FIG. 1 as shown to supply input signals to the field effect transistors in response to the units position of units switch 162 to restrict the range between the predetermined UHF tuning frequencies. For instance, if channel 44 were selected, the VHF-UHF units pre-decoder logic circuit 183 provides a low voltage signal to field effect transistors 221 and 224 turning them off. This in effect, derives fine tuning voltages from the coarse tuning voltages on lines 181 and 182 and is applied to resistor 170 at terminals 260 and 261. Now, instead of resistor 170 tuning from channels 40–50, its tuning range is restricted to channels 42–46. As indicated by the units subscript numerals representing the VHF-UHF pre-decoder logic output for each input terminal, as different units are selected, designated ones of resistors 254–259 will be placed in series on either side of resistor 170 to restrict its tuning range on either side of the desired channel.

The present invention provides fine tuning voltages derived from voltages to equalize the fine tuning effect across the UHF band so that it is substantially equal to the VHF fine tuning effect. The tuning voltage on wiper 170' is, as in the operation of VHF, applied to the UHF tuner as represented by varactor diode 230. For UHF reception, switch 231 is closed adding resistor 232 as an additional load on AFC equalization.

The present invention provides a tuning system with means for tuning any UHF and VHF channel in an essentially equalized manner by establishing a limited and substantially equal fine tuning range for each desired channel. This allows VHF and UHF reception to be accomplished on an equalized basis and the viewer need not know whether he is tuning within the UHF or VHF band.

While particular embodiments of the invention have been shown and described, modifications may be made, and it is intended in the appended claims to cover all such modifications as may fall within the true spirit and scope of the invention.

I claim:

1. In a television tuning system:

a tuner including a varactor diode; a variable resistor, said tuner being tunable by tuning voltages supplied to said varactor diode from said variable resistor; channel selection means for digitally selecting any channel by decade and unit selection; first electronic digital to analog converter means for establishing coarse tuning voltages defining a relatively broad tuning range in response to said decade selections; and fine tuning range means effecting limited and substantially equal fine tuning ranges for all channels comprising;

second electronic digital to analog converter means responsive to said unit selection for providing a control effect in accordance with the selected unit;

voltage dividing means including said variable resistor coupled to said first electronic means and to said second electronic means to derive from said coarse tuning voltages fine tuning voltages which define limited and substantially equal fine tuning ranges for all unit selections;

said voltage dividing means including electronic switching means coupled to said second electronic means and in circuit with said variable resistor; said electronic switching means operable in accordance with said control effect to change the potential supplied across said variable resistor; and means coupling the variable element of said variable resistor to said varactor tuner.

2. A television tuning system in accordance with claim 1 wherein said electronic switching means comprises a plurality of FET switches, each said FET switch having an impedance element coupled thereacross, said FET switches selectively bridging certain ones of said impedance elements in response to said control effect to derive said fine tuning voltages from said coarse tuning voltages.

3. In a television tuning system comprising a tuner including a varactor diode; a variable resistor, said tuner being tunable by tuning voltages supplied to said varactor diode from said variable resistor, channel selection means for digitally selecting channels by decade and unit selection, first electronic digital to analog converter means for establishing coarse tuning voltages defining a relatively broad tuning range in response to said decade selections, and second electronic digital to analog converter means for effecting limited and substantially equal fine tuning ranges for all channels in response to said unit selections comprising:

a plurality of FET switches, each having a gate input and a pair of main terminals, with the main terminals of said switches coupled together to form two sets of serially connected switches, one end of each said set of serially connected switches coupled to said first electronic means;

means coupling said variable resistor between said two sets of serially connected switches;

a resistance coupled across the main terminals of each said FET switch; and means coupling said gate inputs to said second electronic converter means for activating certain ones of said resistances in response to said unit selections and thereby derive from said coarse tuning voltages fine tuning voltages defining limited and substantially equal fine tuning ranges across said variable resistor for all said unit selections.

* * * * *